United States Patent
Parkhe

(10) Patent No.: US 12,331,984 B2
(45) Date of Patent: Jun. 17, 2025

(54) CRYOGENIC MICRO-ZONE ELECTROSTATIC CHUCK CONNECTOR ASSEMBLY

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 819 days.

(21) Appl. No.: 17/356,281

(22) Filed: Jun. 23, 2021

(65) Prior Publication Data

US 2022/0359255 A1 Nov. 10, 2022

Related U.S. Application Data

(60) Provisional application No. 63/186,728, filed on May 10, 2021.

(51) Int. Cl.
*H01L 21/683* (2006.01)
*F25D 19/00* (2006.01)
*H01J 37/32* (2006.01)

(52) U.S. Cl.
CPC ...... *F25D 19/006* (2013.01); *H01J 37/32724* (2013.01); *H01J 2237/2007* (2013.01); *H01J 2237/334* (2013.01); *H01L 21/6833* (2013.01)

(58) Field of Classification Search
CPC ............. F25D 19/006; H01L 21/67103; H01L 21/6831; H01L 21/68785; H01L 21/67109; H01J 2237/334
See application file for complete search history.

(56) References Cited

U.S. PATENT DOCUMENTS 5,376,213 A * 12/1994 Ueda ................. H01L 21/67126
156/345.53
5,535,090 A * 7/1996 Sherman ............. H01L 21/6833
279/128

(Continued)

FOREIGN PATENT DOCUMENTS

JP H08162518 A 6/1996
JP 2013143512 A 7/2013

(Continued)

OTHER PUBLICATIONS

U.S. Appl. No. 17/174,591, filed Feb. 12, 2021 Entitled "Semiconductor Processing With Cooled Electrostatic Chuck".

(Continued)

*Primary Examiner* — Frantz F Jules
*Assistant Examiner* — Martha Tadesse
(74) *Attorney, Agent, or Firm* — Patterson + Sheridan, LLP

(57) ABSTRACT

Embodiments of the present disclosure generally relate to a cryogenic micro-zone connection assembly for a substrate support assembly suitable for use in cryogenic applications. In one or more embodiments, the cryogenic micro-zone connection assembly has a first end having a micro-zone connector. A second end has a socket connection. A flange is disposed between the micro-zone connector and the socket connection. And a wiring harness is coupled at the first end to the micro-zone connector, extends through the flange and is coupled at the second end to the socket connection.

20 Claims, 3 Drawing Sheets

(56) References Cited

U.S. PATENT DOCUMENTS

| | | | |
|---|---|---|---|
| 5,665,166 A * | 9/1997 | Deguchi | H01J 37/32174 |
| | | | 118/724 |
| 6,219,219 B1 | 4/2001 | Hausmann et al. | |
| 2007/0044718 A1* | 3/2007 | Natsuhara | H01L 21/67248 |
| | | | 156/345.52 |
| 2014/0087587 A1* | 3/2014 | Lind | H01J 37/32532 |
| | | | 439/527 |
| 2017/0215230 A1* | 7/2017 | Parkhe | H01L 21/67248 |
| 2020/0185248 A1 | 6/2020 | Sarode Vishwanath et al. | |
| 2021/0082730 A1 | 3/2021 | Sarode Vishwanath et al. | |

FOREIGN PATENT DOCUMENTS

| | | | |
|---|---|---|---|
| JP | 2015142042 A | 8/2015 | |
| JP | 2020-004809 A | 1/2020 | |
| JP | 2021-015933 A | 2/2021 | |
| TW | 201834027 A | 9/2018 | |
| TW | 201837976 A | 10/2018 | |
| WO | 2020123069 A1 | 6/2020 | |

OTHER PUBLICATIONS

International Search Report and Written Opinion for Application No. PCT/US2022/024463 dated Aug. 1, 2022.
Taiwan Office Action for Application No. 111115924 dated Mar. 28, 2024.
Korean Office Action for Application No. 10-2023-7042391 dated Dec. 13, 2024.
Japanese Office Action for Application No. 2023-568625 dated Jan. 7, 2025.

* cited by examiner

CRYOGENIC MICRO-ZONE ELECTROSTATIC CHUCK CONNECTOR ASSEMBLY

CROSS-REFERENCE TO RELATED APPLICATIONS

This application claims priority to U.S. Provisional Patent Application Ser. No. 63/186,728, filed May 10, 2021, which is incorporated herein by reference in its entirety.

BACKGROUND

Field

Embodiments of the present disclosure generally relate to apparatus and processes for microelectronic manufacturing, and more specifically, to a substrate support assembly having an electrostatic chuck assembly used in cryogenic applications.

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development require processing at vacuum with temperatures below 0° C., and even as low as −200° C., while processing films on a substrate disposed on a substrate support.

Some of these low, at times cryogenic (less than −153° C.), temperature fabrication techniques are performed in processing chambers that utilize electrostatic chucks to secure a substrate being processed within the chamber. Conventional electrostatic chucks have an electrode for chucking the substrate and are part of a substrate support assembly that includes heaters and a cooling plate to more precisely controlling the processing temperature at the substrate. The conventional electrostatic chucks has many electrical connectors for coupling power to the heaters and electrodes. For example, an exemplary conventional electrostatic chuck may have 150 more connectors for coupling power to the heaters and electrodes.

In cryogenic applications, a cryogenic fluid is circulated in the cooling plate to remove heat from the substrate. The cooling plate may be in a portion of the substrate support assembly that is at atmospheric pressure, while the electrostatic chuck having the heaters is at vacuum pressures. The electrical connectors for the electrostatic chuck must traverse through both the vacuum and atmospheric pressures in the substrate support assembly. The cooling plate can be cooled to temperatures of less than 0° C., such as from about −10° C. to about −100° C. or lower. At such low temperatures, the electrical connectors heated by the electrostatic chuck may have condensation form thereon, or even ice over at the cooling plate. The condensation at the electrical connector introduces a mode of failure for the electrical connections and other components of the substrate support assembly due to corrosion and electrical shorts.

Thus, there is a need for an improved substrate support assembly suitable for use in cryogenic applications.

SUMMARY

Embodiments of the present disclosure generally relate to a cryogenic micro-zone connection assembly for a substrate support assembly suitable for use in cryogenic applications. In one or more embodiments, the cryogenic micro-zone connection assembly has a first end having a micro-zone connector. A second end of the cryogenic micro-zone connection assembly has a socket connection. A flange is disposed between the micro-zone connector and the socket connection. A wiring harness is coupled at the first end to the micro-zone connector. The wiring harness extends through the flange and is coupled at the second end to the socket connection.

In one or more embodiments, a substrate support assembly configured to operate at temperatures of less than 0° C. is disclosed. The substrate support assembly has an electrostatic chuck, a cooling plate, and cryogenic micro-zone connection assembly. The electrostatic chuck has a workpiece supporting surface opposite a bottom surface. The cooling plate has a top surface, a bottom surface, and a cavity extending through the top surface and the bottom surface. The cavity of the cooling plate has a recessed step at the bottom surface. A bonding film is disposed between the electrostatic chuck and the cooling plate. The bonding film includes a bonding layer comprising a silicone material. An optional facility plate is coupled to the bottom surface of the cooling plate. The cryogenic micro-zone connection assembly has a first end having a micro-zone connector. A second end of the cryogenic micro-zone connection assembly has a socket connection. A flange is disposed between the micro-zone connector and the socket connection. A wiring harness is coupled at the first end to the micro-zone connector. The wiring harness extends through the flange and is coupled at the second end to the socket connection.

In one or more embodiments, a cryogenic processing chamber is disclosed. The cryogenic processing chamber has a chamber body having sidewalls, a bottom and a lid enclosing an interior processing region. A substrate support assembly is disposed in the interior processing region. The substrate support assembly is configured to operate at temperatures of less than 0° C. is disclosed. The substrate support assembly has an electrostatic chuck, a cooling plate, and cryogenic micro-zone connection assembly. The electrostatic chuck has a workpiece supporting surface opposite a bottom surface. The cooling plate has a top surface, a bottom surface, and a cavity extending through the top surface and the bottom surface. The cavity of the cooling plate place has a recessed step at the bottom surface. A bonding film is disposed between the electrostatic chuck and the cooling plate. The bonding film includes a bonding layer comprising a silicone material. An optional facility plate is coupled to the bottom surface of the cooling plate. The cryogenic micro-zone connection assembly has a first end having a micro-zone connector. A second end of the cryogenic micro-zone connection assembly has a socket connection. A flange is disposed between the micro-zone connector and the socket connection. A wiring harness is coupled at the first end to the micro-zone connector. The wiring harness extends through the flange and is coupled at the second end to the socket connection.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to a substrate support assembly suitable for use in cryogenic applications. Used herein, cryogenic processing temperatures refer to temperatures less than 0° C. In one or more embodiments, the substrate support assembly has a cooling plate coupled to an electrostatic chuck with secondary heaters for discrete temperature control at cryogenic processing temperatures of less than 0° C., and less than −10° C., such as temperatures of about −50° C., about −80° C., about −100° C. to about −110° C., about −120° C., about −135° C., about −150° C. or about −200° C. For example, the substrate support assembly is used at a cryogenic processing temperature of about −50° C. to about −150° C.

The substrate support assembly has primary heaters and a plurality of secondary heaters. The substrate support assembly has a cryogenic micro-zone connection assembly uniquely configured to operate the secondary heaters. The cryogenic micro-zone connection assembly enables discrete control of temperatures at a substrate undergoing cryogenic processing while disposed on the electrostatic chuck. The cryogenic micro-zone connection assembly includes a number of electrical connectors, flanges or insulator blocks and gaskets to connect the secondary heaters to a control board disposed inside the substrate support assembly. The arrangements of the flanges and gasket allow the cryogenic micro-zone connection assembly to extend from a vacuum environment to an atmospheric environment and be used over a wide variety of temperatures without the formation of condensation on the cryogenic micro-zone connection assembly or within the substrate support assembly. The cryogenic micro-zone connection assembly minimizes corrosion and shorts due to condensation in the electrical components of the substrate support assembly. Thus, the cryogenic micro-zone connection assembly extends the service life and reliability of the substrate support assembly.

Figure 1:
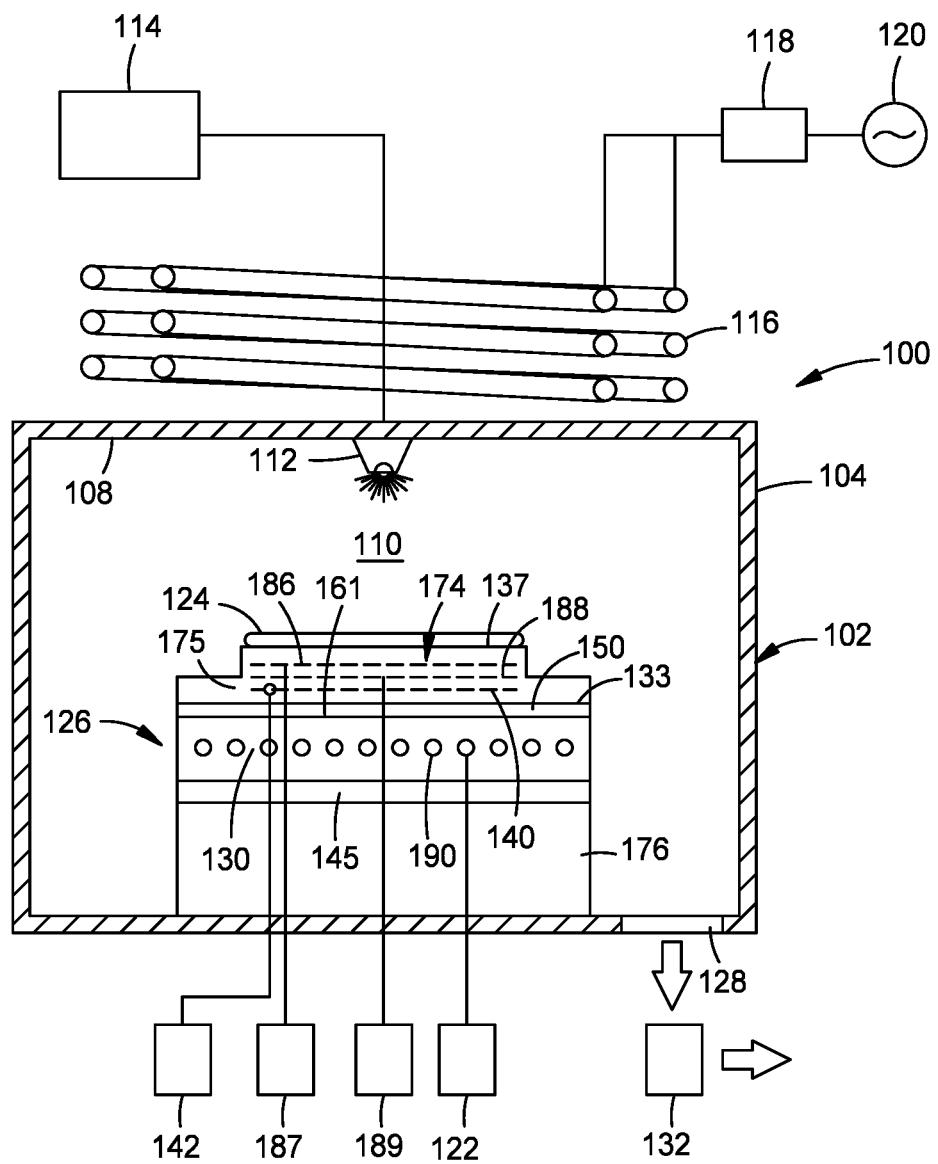
FIG. 1 depicts a cross-sectional schematic side view of a processing chamber containing a substrate support assembly having an electrostatic chuck, according to one or more embodiments described and discussed herein.

FIG. 1 is a cross-sectional schematic view of an exemplary cryogenic processing chamber 100, shown configured as an etch chamber, having a substrate support assembly 126. The substrate support assembly 126 may be utilized in other types of processing plasma chambers, for example plasma treatment chambers, annealing chambers, physical vapor deposition (PVD) chambers, chemical vapor deposition (CVD) chambers, and ion implantation chambers, among others, as well as other systems where the ability to control processing uniformity for a surface or substrate, such as a substrate, is desirable. Control of the dielectric properties tan (o), e.g., dielectric loss, or p, e.g., the volume resistivity at elevated temperature ranges for the substrate support assembly 126 beneficially enables azimuthal processing control, e.g., processing uniformity, for a substrate 124 disposed on the substrate support assembly 126.

The cryogenic processing chamber 100 includes a chamber body 102 having sidewalls 104, a bottom and a lid 108 that enclose an interior processing region 110. An injection apparatus 112 is coupled to the sidewalls 104 and/or lid 108 of the chamber body 102. A gas panel 114 is coupled to the injection apparatus 112 to allow process gases to be provided into the interior processing region 110. The injection apparatus 112 may be one or more nozzle or inlet ports, or alternatively a showerhead. Processing gas, along with any processing by-products, are removed from the interior processing region 110 through an exhaust port 128 formed in the sidewalls 104 or bottom 106 of the chamber body 102. The exhaust port 128 is coupled to a pumping system 132, which includes throttle valves and pumps utilized to control the vacuum levels within the interior processing region 110.

The processing gas may be energized to form a plasma within the interior processing region 110. The processing gas may be energized by capacitively or inductively coupling RF power to the processing gases. In the embodiment depicted in FIG. 1, a plurality of coils 116 are disposed above the lid 108 of the cryogenic processing chamber 100 and are coupled through a matching circuit 118 to an RF power source 120. Power is applied to the plurality of coils 116 to inductively couple power to the processing gas to form a plasma within the interior processing region 110.

The substrate support assembly 126 is disposed in the interior processing region 110 below the injection apparatus 112. The substrate support assembly 126 includes an electrostatic chuck (ESC) 174 and a cooling plate 130. The cooling plate 130 is supported by a base plate 176. The base plate 176 is supported by one of the sidewalls 104 or bottom 106 of the cryogenic processing chamber 100. The substrate support assembly 126 may additionally include a heater assembly (not shown). Additionally, the substrate support assembly 126 may include a facility plate 145 and/or an insulator plate (not shown) disposed between the cooling plate 130 and the base plate 176 to facilitate electrical, cooling, and gas connections with the substrate support assembly 126.

The cooling plate 130 is formed from or otherwise contains one or more metal materials. In one or more examples, the cooling plate 130 contains one or more aluminum alloys, one or more aluminum-silicon alloys, one or more aluminum-molybdenum alloys, one or more aluminum-molybdenum-silicon alloys, and other alloys and/or composite materials as further described and discussed herein. The cooling plate 130 includes a plurality of cooling channels 190 formed therein. The cooling channels 190 are connected to a heat transfer fluid source 122. The heat transfer fluid source 122 provides a heat transfer fluid, such as a liquid, gas or combination thereof, which is circulated through one or more cooling channels 190 disposed in the cooling plate 130. The fluid flowing through neighboring cooling channels 190 may be isolated to enable local control of the heat transfer between the ESC 174 and different regions of the cooling plate 130, which assists in controlling the lateral temperature profile of the substrate 124. In one or more embodiments, the heat transfer fluid circulating through the cooling channels 190 of the cooling plate 130 maintains the cooling plate 130 at a temperature of less than 0° C., such as about −40° C. to about −100° C.

The ESC 174 generally includes a chucking electrode 186 embedded in a dielectric body 175. The chucking electrode 186 may be configured as a mono polar or bipolar electrode, or other suitable arrangement. The chucking electrode 186 is coupled through an RF filter to a chucking power source 187, which provides a DC power to electrostatically secure the substrate 124 to the substrate support surface 137 of the ESC 174. The RF filter prevents RF power utilized to form a plasma (not shown) within the cryogenic processing chamber 100 from damaging electrical equipment or presenting an electrical hazard outside the chamber.

The substrate support surface 137 of the ESC 174 includes gas passages (not shown) for providing backside heat transfer gas to the interstitial space defined between the substrate 124 and the substrate support surface 137 of the ESC 174. The ESC 174 also includes lift pin holes for accommodating lift pins (not shown) for elevating the substrate 124 above the substrate support surface 137 of the ESC 174 to facilitate robotic transfer into and out of the cryogenic processing chamber 100.

A bonding layer 150 is disposed below the ESC 174 and secures the ESC 174 to the cooling plate 130. In other embodiments, the bonding layer 150 is disposed between the ESC 174 and a lower plate that is disposed between the ESC 174 and cooling plate 130, as will be described further below. The bonding layer 150 may have a thermal conductivity between about 0.1 W/mK and about 5 W/mk. The bonding layer 150 may be formed from several layers which compensate for different thermal expansion between the ESC 174 and underlying portions of the substrate support assembly 126, such as for example, the cooling plate 130. The layers containing the bonding layer 150 may be formed from different materials and is discussed in reference to subsequent figures illustrating separate embodiments.

The ESC 174 includes one or more electrodes 186 for chucking a substrate. The electrodes 186 are disposed in a dielectric body 175 of the ESC 174. The dielectric body 175 of the ESC 174 has a substrate support surface 137 and a bottom surface 133 opposite the substrate support surface 137. The dielectric body 175 of the ESC 174 is fabricated from a ceramic material, such as alumina ($Al_2O_3$), aluminum nitride (AlN) or other suitable material. Alternately, the dielectric body 175 may be fabricated from a polymer, such as polyimide, polyetheretherketone, polyaryletherketone and the like.

The dielectric body 175 optionally includes one or more primary resistive heaters 188 embedded therein. The primary resistive heaters 188 are utilized to elevate the temperature of the substrate support assembly 126 to a temperature suitable for processing a substrate 124 disposed on the substrate support surface 137 of the substrate support assembly 126. The primary resistive heaters 188 are coupled through the facility plate 145 to a heater power source 189. The heater power source 189 may provide 900 watts or more power to the primary resistive heaters 188. A controller (not shown) is utilized control the operation of the heater power source 189, which is generally set to heat the substrate 124 to a predefined temperature. In one or more embodiments, the primary resistive heaters 188 include a plurality of laterally separated heating zones, wherein the controller enables at least one zone of the primary resistive heaters 188 to be preferentially heated relative to the primary resistive heaters 188 located in one or more of the other zones. For example, the primary resistive heaters 188 may be arranged concentrically in a plurality of separated heating zones. In one example, the primary resistive heaters 188 are arranged in four concentric primary heater zones, such as a first primary heater zone, a second primary heater zone, a third primary heater zone, and a fourth primary heater zone. The primary resistive heaters 188 may maintain the substrate 124 at a temperature suitable for processing, such as between about 180° C. to about 500° C., such as greater than about 250° C., such as between about 250° C. and about 300° C.

In one or more embodiments, the dielectric body 175 of the ESC 174 has a plurality of secondary heaters 140 producing a micro-zone effect. The secondary heaters 140 form temperature control in small discrete locations, i.e., micro-zones on the ESC 174. Here, micro-zones refer to discretely temperature controllable areas of the ESC 174 where there may be 10, about 50, about 80, or about 100 micro-zones to about 120, about 150, about 200, or more micro-zones on the ESC 174. The number of secondary heaters 140 may be an order of magnitude greater than the number of primary resistive heaters 188. The secondary heaters 140 serve to control the temperature of the ESC 174 at a micro level, such as plus or minus 5 degrees Celsius, while the primary resistive heaters 188 control the temperature of the ESC 174 at a macro level. The micro-zones are temperature controlled by the secondary heaters 140.

The secondary heaters 140 may be configured in a pattern to efficiently generate a heat profile along the surface of the substrate support assembly 126. The pattern may be symmetric about a midpoint while providing clearance in and around holes for lift pins or other mechanical, fluid or electrical connections. The secondary heaters 140 are arranged in a plurality of cells, i.e., micro-zones. It is contemplated that each secondary heater 140 occupies a respective single micro-zone.

Each secondary heater 140 has a resistor ending in terminals. As current enters one terminal and exits the other terminal the current travels across the wire of the resistor and generates heat. The amount of heat released by the resistor is proportional to the square of the current passing therethrough. The power design density may be between about 1 watt/cell to about 100 watt/cell, such as 10 watt/cell.

Each secondary heater 140 may be controlled by a controller 142. The controller 142 may turn on a single secondary heater 140; or a plurality of secondary heaters 140 grouped together. In this manner, temperature can be precisely controlled at independent locations along the micro-zones formed in the ESC 174, such independent locations not limited to concentric ring such as known in the art. Although the pattern shown is comprised of smaller units, the pattern may alternatively have larger and/or smaller units, extend to the edge, or have other forms to form 150 or more discrete micro-zones.

Figure 2:
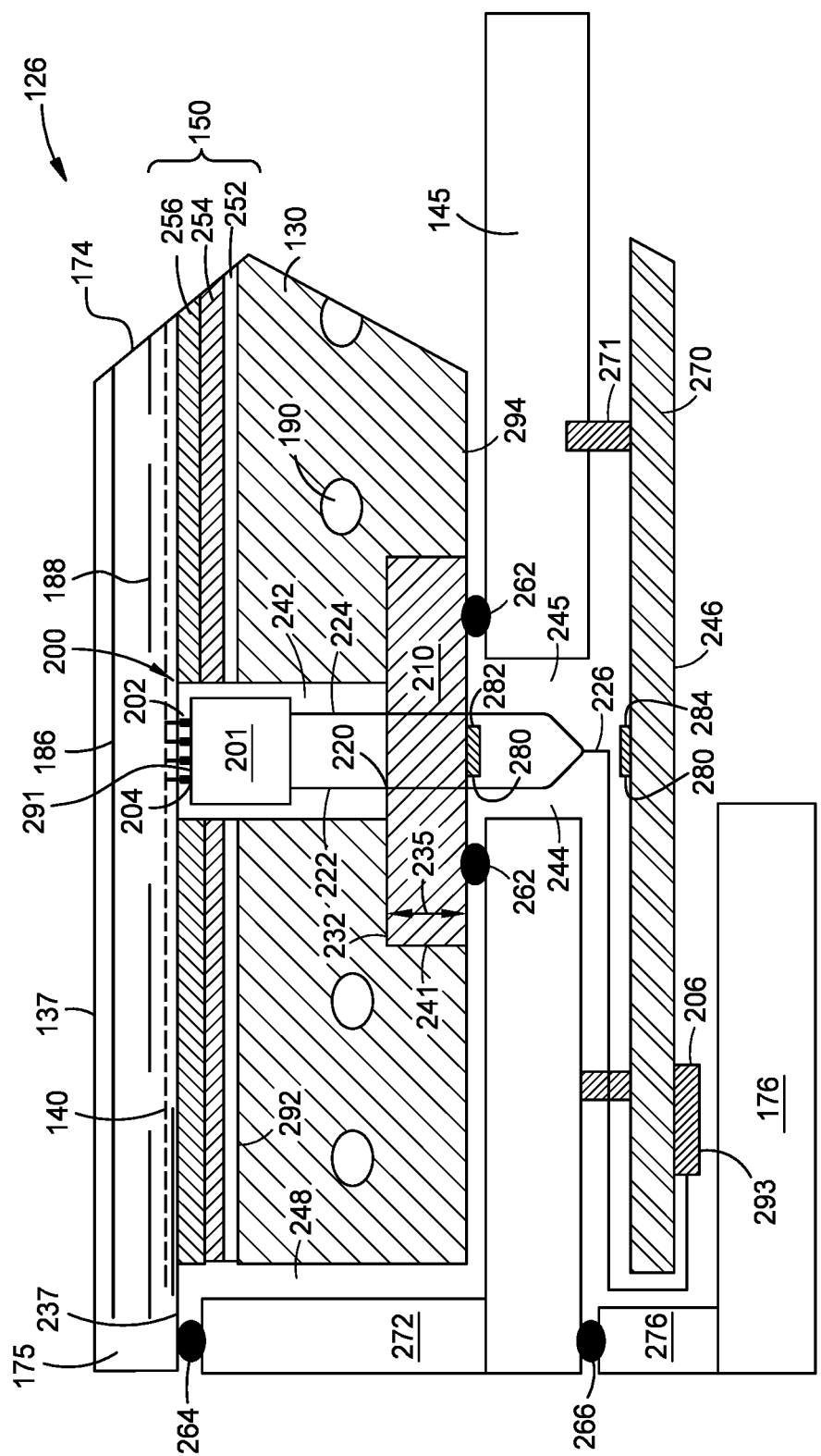
FIG. 2 depicts a cross-sectional schematic side view of the substrate support assembly having a cryogenic micro-zone connection assembly, according to one or more embodiments described and discussed herein.

In one or more examples, the ESC 174 contains about 50 heaters to about 200 heaters disposed therein. Each heater can be independently enabled to control temperature in a respective zone. A micro-zone connector 201 enables the connection of the secondary heater 140 in a cryogenic environment. FIG. 2 depicts a cross-sectional schematic side view of the substrate support assembly 126 having the micro-zone connector 201, according to one or more embodiments described and discussed herein. The micro-zone connector 201 is configured to operate in the substrate support assembly 126 at a temperature of about 0° C. to about −140° C.

FIG. 2 depicts a cross-sectional schematic side view of the substrate support assembly 126 having a cryogenic micro-zone connection assembly 200, according to one or more embodiments described and discussed herein. It should be appreciated that FIG. 2 depicts but a portion of the substrate support assembly 126 along the outer periphery and at but one location where one cryogenic micro-zone connection assembly 200 is located. It should also be appreciated that the substrate support assembly 126 may have a plurality of cryogenic micro-zone connection assemblies 200, for example, at least one for every secondary heaters 140.

The substrate support assembly 126 may have a first side wall 272 extending between the facility plate 145 and the ESC 174. In some examples, the first side wall 272 is part of the facility plate 145. A gasket 264 is disposed between the first side wall 272 and the ESC 174. The gasket 264 provides an airtight seal between the first side wall 272 and the ESC 174. A second side wall 276 may extend between the facility plate 145 and the base plate 176. In some examples, the second side wall 276 is part of the base plate 176. A gasket 266 is disposed between the second side wall 276 and the facility plate 145. The gasket 266 provides an airtight seal between the second side wall 276 and the facility plate 145. Various components of the substrate support assembly 126 such as the bonding layer 150, the cooling plate 130 and a printed circuit (PC) board 270, are disposed inward of the sidewalls, first side wall 272 and second side wall 276. The first side wall 272 and the second side wall 276 detect the various components of the substrate support assembly 126 from the processing environment.

The bonding layer 150 secures a bottom 237 of the ESC 174 to a top surface 292 of the cooling plate 130. The bonding layer 150 includes a silicone bond 256, a molybdenum bond 254 and the indium bond 252. A cavity 242 extends through the cooling plate 130 and through the bonding layer 150 to expose the bottom 237 of the ESC 174. The cavity 242 aligns with the location for one or more of a plurality of connectors 204 of the secondary heaters 140.

The cryogenic micro-zone connection assembly 200 has a plurality of connectors 204 at a first end 291 and a socket connection 206 at a second end 293 distal located from the first end 291. The cryogenic micro-zone connection assembly 200 includes a micro-zone connector 201, a flange 210, and a wiring harness 226. The cryogenic micro-zone connection assembly 200 may additionally include one or more heaters 280 such as heaters 282, 284. The heaters 280 are disposed below the cooling plate 130. The heaters 280 are discussed further below. The cryogenic micro-zone connection assembly 200 is disposed within the substrate support assembly 126 and extends from the ESC 174 at the first end 291, through the cooling plate 130 and facility plate 145, into the base plate 176 at the second end 293.

The micro-zone connector 201 may be formed from a low temperature compatible material, such as materials that can be used at temperatures below 200° C. The micro-zone connector 201 may be formed from polyimide, alumina, ceramic or other suitable material. The micro-zone connector 201 has a plurality of connectors 204. In one example the micro-zone connector 201 has between 25 and 100 connectors 204, such as 50 connectors 204.

The connectors 204 may couple to and engage with a plurality of corresponding heater connectors 202. The heater connectors 202 are coupled to the secondary heaters 140. In one example, each heater connector 202 is coupled to a respective secondary heater 140, such that there is a one-to-one correspondence between the secondary heaters 140 and each connector 204. In this manner individual control for each secondary heater 140 can be provided over a respective connector 204. That is, one connector 204 provides power and control to one secondary heater 140. In another example, each micro-zone connector 201 may handle a plurality of heater connections. For example, in a substrate support assembly 126 having 150 heaters, there may be three equally spaced micro-zone connector 201, each micro-zone connector 201 coupled to 50 heaters.

Figure 3:
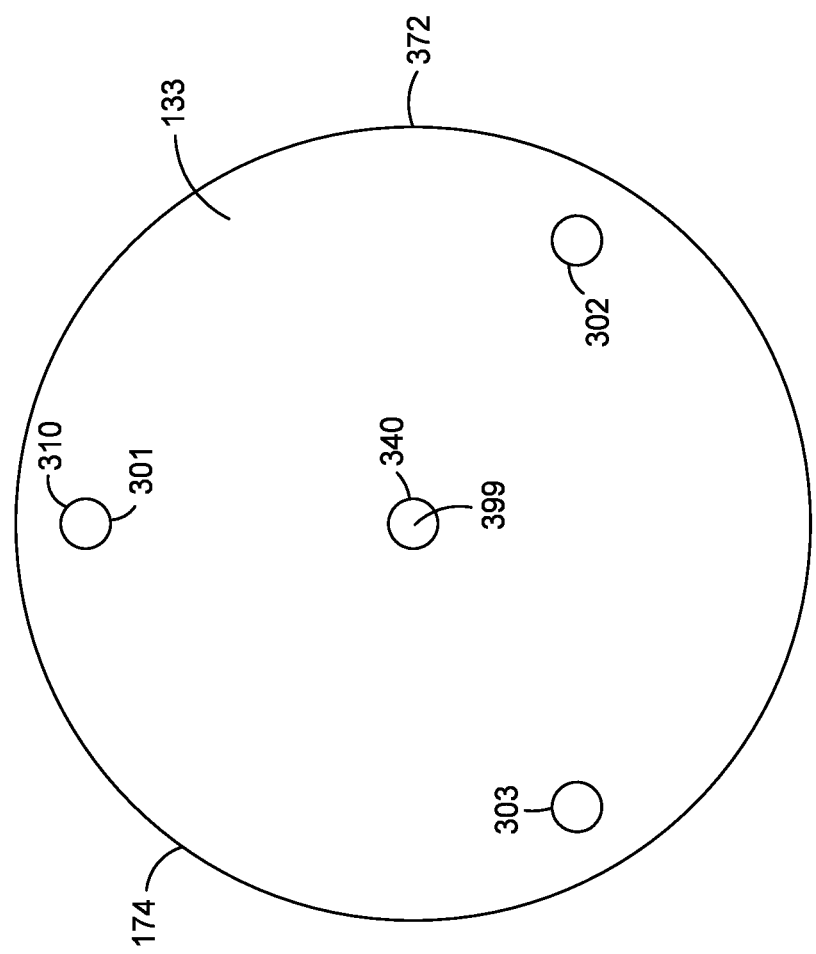
FIG. 3 depicts schematic bottom view of the electrostatic chuck illustrating a connection schema of the micro-zone connector, according to one or more embodiments described and discussed herein.

Turning briefly to FIG. 3, FIG. 3 depicts schematic bottom view of the ESC 174 illustrating a connection schema of the micro-zone connector 201. The bottom surface 133 of the ESC 174 may have a plurality heater interfaces 310 disposed along a periphery 372 of the bottom surface 133 of the ESC 174. The primary heater interface 340 for controlling and powering the primary resistive heaters 188 may be located at a center 399 of the ESC 174. The connectors 204 may be grouped at a heater interface 310 on the bottom surface 133 of the ESC 174. Each heater interface 310 may serve as a connection to provide power to the secondary heaters 140. In one example, each heater interface 310 have between about 10 and about 50 connectors 204 individually controlling between about 10 and about 50 secondary heaters 140. In one example, the ESC 174 has 150 secondary heaters 140 grouped to three of the heater interfaces 310. For example, a first heater connection 301 may operate a first group of 50 secondary heaters 140, a second heater connection 302 may operate a second group of 50 secondary heaters 140, while a third heater connection 303 may operate a third group of 50 secondary heaters 140. The first heater connection 301, the second heater connection 302 and the third heater connection 303 permit individual control of up to 150 secondary heaters 140. Each of the heater interface 310 has a number of heater connectors 202 corresponding to a respective secondary heater 140. In one example, each heater interface 310 has 50 individual heater connectors 202 providing power to separate secondary heaters 140. It should be appreciated however, that there may be more or less than 150 secondary heaters 140 and therefore there may be more or less heater interfaces 310 for the secondary heaters 140.

Returning back to FIG. 2, the connectors 204 and the heater connector 202 may be of a type allowing for electrical connection to be made across the connectors 204 and the heater connector 202. In one example, the connectors 204 are female and the heater connectors 202 are male, e.g., a socket and pin. In another example, the connectors 204 are male and the heater connectors 202 are female. The connectors 204 mate with the heater connectors 202 providing electrical connectivity to the secondary heaters 140.

The cooling plate 130 has a bottom surface 294 and a top surface 292. The cooling plate 130 has a plurality of the cavities 242 extending from the top surface 292 the bottom surface 294. The cooling plate 130 has a recessed step 232 formed at the cavities 242 along the bottom surface 294 of the cooling plate 130. The recessed step 232 extends a depth 235 into the bottom surface 294.

The flange 210 is disposed in the recessed step 232 of the cooling plate 130. The flange 210 is of a height substantially similar to the depth 235 and sized to fit in the recessed step 232 such that the bottom surface of the flange 210 is substantially coplanar with the bottom surface 294 of the cooling plate 130. Alternately, the flange 210 may extend slightly beyond the bottom surface 294 of the cooling plate 130. In yet other alternatives, the flange 210 may be recessed slightly inward of the bottom surface 294 of the cooling plate 130. The flange 210 is formed of a material having low thermal conductivity. The flange 210 may be formed of thermally insulating material such as alumina, polyimide, a thermoplastic such as polyphenylene sulfide, metal, silicone, high temperature polyimide (such as VESPEL® and MELDIN®), or other suitable thermally insulating material. The flange 210 may additionally be formed from an electrically insulating material.

The flange 210 has one or more sealed leads 220 such as a first lead 222 and a second lead 224, extending through the flange 210. The sealed lead 220 may contain 50 or more individual connections. For example, the sealed lead 220 may be a wire bundle of 50 electric cables bundled together in an insulating jacket such as polyimide insulation. The sealed lead 220 extends through the flange 210. The sealed leads 220 extend through the flange 210 in a manner such that fluids, such as liquid or gases, cannot pass through the flange 210 along the sealed leads 220. The sealed lead 220 is configured to prevent fluid transmission from traversing through the flange 210. The sealed leads 220 are coupled to the micro-zone connector 201. The sealed leads 220 contain each connection extending through the micro-zone connector 201. For example, the sealed leads 220 may contain 50 or more wired connections for controlling the secondary heaters 140.

In some examples, the sealed leads 220 are configured to be removeably connected to and from the first lead 222 and the second lead 224, such as pin connectors, to aid in the installation. In other examples, the sealed leads 220 are integral with the first lead 222 and the second lead 224 to ensure good connectivity. In yet another example, the sealed leads 220 extend through the flange 210 and are configured to be removeably connected to the wiring harness 226. In yet another example, the sealed leads 220 extend through the flange 210 and are integrally a part of the wiring harness 226. To aid in assembly, the first lead 222 and the second lead 224 may be sufficiently long to permit the micro-zone connector 201 to connect to the secondary heaters 140 while the flange 210 is clear of the recessed step 232. Alternately, the first lead 222 and the second lead 224 may be rigidly attached to both the micro-zone connector 201 and the flange 210 such that pushing the flange 210 into the recessed step 232 pushes the micro-zone connector 201 to make the connections with the secondary heaters 140. It should be appreciated that the functionality does not change in either arrangement for assembling the micro-zone connection assembly 200 while other arrangements for ease of assembly may be equally suitable.

A seal 262 is disposed between the flange 210 and the facility plate 145. The seal 262 provides an airtight seal between the flange 210 and the facility plate 145. Thus, a differential pressure may exist across the seal 262. For example, on one side of seal 262 may be vacuum pressure while on the other side of seal 262 may be atmospheric pressure.

The facility plate 145 may have one or more passages 245 extending through the facility plate 145. The passages 245 are provided to permit cabling from the electrostatic chuck 174 and other components of the substrate support assembly 126 to extend into the base plate 176 of the substrate support assembly 126. The sealed leads 220 extend into the passages 245 and couple with the wiring harness 226.

The PC board 270 may be coupled to the facility plate 145. For example, the PC board 270 may be coupled to the facility plate 145 by one or more standoffs 271. The PC board 270 is disposed within the base plate 176. The PC board 270 may be a programmable logic controller, or other suitable hardware configured to control operations and components of the ESC 174. In one example, PC board 270 controls the secondary heaters 140. The wiring harness 226 extends to the socket connection 206 at the PC board 270 for electrically coupling the PC board 270 to the secondary heaters 140 through the micro-zone connector 201.

The substrate support assembly 126 is provided in a vacuum processing environment for processing substrates disposed on the ESC 174. However, it should be noted that portions of the substrate support assembly 126 are at atmospheric pressure. For example, a first internal portion 248 is at vacuum pressure while a second internal portion 244 is at atmospheric pressure. The plurality of gaskets/seals 262, 264, 266 provide the necessary seal for maintaining the first internal portion 248 at vacuum while the second internal portion 244 is at atmospheric pressure. Additionally, the cavities 242 may be fluidly coupled to the first internal portion 248 such that the cavities 242 are at vacuum pressures. For example, the flange 210 does not seal against the cooling plate 130 in the recessed step 232 such that the vacuum in the first internal portion 248 extends into the cavity 242 between the flange 210 and the ESC 174. Alternately, the flange 210 can be sealed against the cooling plate 130 with an O-ring, gasket or other suitable seal.

Additionally, the vacuum processing environment is maintained at cryogenic temperatures for processing the substrate. For example, the substrate support assembly 126 may be operable to process a substrate at temperatures of less than 0° C., and less than −10° C., such as temperatures of about −50° C., about −80° C., about −100° C. to about −110° C., about −120° C., about −135° C., about −150° C. or about −200° C.

Condensation happens when the air is cooled to its dew point or it becomes so saturated with water vapor that it cannot hold any more water. Whether water condenses or not depends on the partial pressure of the water vapor and the temperature. If the temperature of an object is below the boning (or sublimation) point at that pressure the water will condense. The result is that water can condense in a cryogenic vacuum chamber and cause electrical shorts, corrosion or other harm. The cryogenic micro-zone connection assembly 200 prevents condensation from causing electrical shorts and other harms. The flange 210 of the cryogenic micro-zone connection assembly 200 creates a seal between the cavity 242 and the second internal portion 244 to prevent condensation from forming on the cryogenic micro-zone connection assembly 200 providing power and control from the PC board 270 to the secondary heaters 140.

The cryogenic micro-zone connection assembly 200 is designed for use in the cryogenic processing chamber 100 under process ready conditions. For example, the first end 291 of the cryogenic micro-zone connection assembly 200 is at vacuum pressure while simultaneously the second end 293 of the cryogenic micro-zone connection assembly 200 is at atmospheric pressure. In one example, the connector 204 of the cryogenic micro-zone connection assembly 200 may be subject to a vacuum environment at temperatures below the socket connection 206 of the cryogenic micro-zone connection assembly 200 at the PC board 270 in an atmospheric environment. The cryogenic micro-zone connection assembly 200 electrically coupling the PC board 270 to the secondary heaters 140.

In some examples, the cryogenic micro-zone connection assembly 200 may additionally, or optionally, include one or more heaters 280. For example, a first heater 282 may be disposed on the flange 210 in the space of the second internal portion 244 of the substrate support assembly 126. In another example, a second heater 284 may be disposed on the PC board 270 facing the flange 210 in the space of the second internal portion 244 of the substrate support assembly 126. The cryogenic micro-zone connection assembly 200 may use either the first heater 282 and/or the second heater 284 to prevent condensation from forming on the cryogenic micro-zone connection assembly 200 providing power and control from the PC board 270 to the secondary heaters 140.

Advantageously, the cryogenic micro-zone connection assembly 200 with or without the heaters 280 keeps moisture from the PC board 270. The reduction of moisture at the PC board 270 by the cryogenic micro-zone connection assembly 200 prevents electrical shorts at the PC board 270, corrosion of the electrical connections at the PC board 270, and extends the life between maintenance operations for the PC board 270.

While the foregoing is directed to embodiments of the disclosure, other and further embodiments may be devised without departing from the basic scope thereof, and the scope thereof is determined by the claims that follow. As is apparent from the foregoing general description and the specific embodiments, while forms of the present disclosure have been illustrated and described, various modifications can be made without departing from the spirit and scope of the present disclosure. As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A cryogenic micro-zone connection assembly, comprising:
   a first end having a micro-zone connector, the micro-zone connector having a plurality of connectors configured to connect to corresponding heater connectors of a substrate support;
   a second end having a socket connection;
   a flange disposed between the micro-zone connector on a first side and the socket connection on a second side; and
   a wiring harness coupled at the first end to the micro-zone connector, extending through the flange and coupled at the second end to the socket connection, wherein the wiring harness seals against the flange between the first end and the second end and the flange suitable for maintaining a pressure differential between the first end and the second end of the wiring harness.

2. The cryogenic micro-zone connection assembly of claim 1 wherein the micro-zone connector has between about 10 and about 50 connectors.

3. The cryogenic micro-zone connection assembly of claim 1 wherein the flange is formed of an insulating material.

4. The cryogenic micro-zone connection assembly of claim 3 wherein the flange is formed from one of alumina, polyimide, or a thermoplastic.

5. The cryogenic micro-zone connection assembly of claim 1 further comprising:
   a sealed lead extending through the flange, wherein the sealed lead is sealed to the flange in a manner that prevents fluid from passing through the flange along the sealed lead.

6. A substrate support assembly configured to operate at temperatures of less than 0° C., the substrate support assembly comprising: an electrostatic chuck having a workpiece supporting surface opposite a bottom surface; a cooling plate comprising: a top surface; a bottom surface; and a cavity extending through the top surface and the bottom surface of the cooling plate, where the cavity has a recessed step at the bottom surface of the cooling plate; a bonding layer disposed between the electrostatic chuck and the cooling plate, wherein the bonding layer comprises a silicone material; a facility plate coupled to the bottom surface of the cooling plate; and a cryogenic micro-zone connection assembly comprising: a first end having a micro-zone connector coupled to the bottom surface of the electrostatic chuck, the micro-zone connector having a plurality of connectors configured to connect to corresponding heater connectors of the electrostatic chuck; a second end having a socket connection disposed in the facility plate; and a flange disposed in the cooling plate and disposed between the micro-zone connector and the socket connection; and a wiring harness coupled at the first end to the micro-zone connector, extending through the flange and coupled at the second end to the socket connection, wherein the wiring harness seals against the flange between the first end and the second end and the flange suitable for maintaining a pressure differential between the first end and the second end of the wiring harness.

7. The substrate support assembly of claim 6 further comprising:
   a sealed lead extending through the flange wherein the sealed lead is configured to prevent fluid transmission from traversing through the flange.

8. The substrate support assembly of claim 7 further comprising:
   a PC board coupled to the facility plate, wherein the socket connection is electrically coupled to the PC board.

9. The substrate support assembly of claim 7 wherein the micro-zone connector has between about 10 and about 50 connectors.

10. The substrate support assembly of claim 7 wherein the flange is formed of an insulating material.

11. The substrate support assembly of claim 10 wherein the cavity extends through the bonding layer and exposes the bottom surface of the electrostatic chuck and wherein the micro-zone connector is disposed in the cavity.

12. The substrate support assembly of claim 11 wherein the flange is disposed in the recessed step of the cavity.

13. A cryogenic processing chamber comprising: a chamber body having sidewalls, a bottom and a lid enclosing an interior processing region; a substrate support assembly disposed in the interior processing region, the substrate support assembly configured to operate at temperatures of less than 0° C., the substrate support assembly comprising: an electrostatic chuck having a workpiece supporting surface opposite a bottom surface; a cooling plate comprising: a top surface; a bottom surface; and a cavity extending through the top surface and the bottom surface of the cooling plate, where the cavity has a recessed step at the bottom surface of the cooling plate; a bonding film disposed between the electrostatic chuck and the cooling plate, wherein the bonding film comprises a bonding layer comprising a silicone material; a facility plate coupled to the bottom surface of the cooling plate; and a cryogenic micro-zone connection assembly comprising: a first end having a micro-zone connector coupled to the bottom surface of the electrostatic chuck, the micro-zone connector having a plurality of connectors configured to connect to corresponding heater connectors of the electrostatic chuck; a second end having a socket connection disposed in the facility plate; and a flange disposed in the cooling plate and disposed between the micro-zone connector and the socket connection; a wiring harness coupled at the first end to the micro-zone connector, extending through the flange and coupled at the second end to the socket connection, wherein the wiring harness seals against the flange between the first end and the second end and the flange suitable for maintaining a pressure differential between the first end and the second end of the wiring harness; and a seal between the flange and the facility plate, the seal operable to maintain a pressure differential between the first end and the second end of the cryogenic micro-zone connection assembly.

14. The cryogenic processing chamber of claim 13 wherein the substrate support assembly further comprises: a sealed lead extending through the flange wherein the sealed lead is configured to prevent fluid transmission from traversing through the flange.

15. The cryogenic processing chamber of claim 14 further comprising:
a PC board coupled to the facility plate, wherein the socket connection is electrically coupled to the PC board.

16. The cryogenic processing chamber of claim 14 wherein the flange is formed of an insulating material and the flange is disposed in the recessed step of the cavity.

17. The cryogenic processing chamber of claim 16 wherein the cavity extends through the bonding layer and exposes the bottom of the electrostatic chuck and wherein the micro-zone connector is disposed in the cavity.

18. The cryogenic processing chamber of claim 14 wherein the first end of the cryogenic micro-zone connection assembly is at vacuum pressure relative to the second end of the cryogenic micro-zone connection assembly.

19. The cryogenic processing chamber of claim 14 further comprising:
a heater disposed below the cooling plate.

20. The cryogenic processing chamber of claim 13 further comprising:
a seal formed between the flange and the facility plate.

* * * * *